United States Patent
Malolepszy et al.

(10) Patent No.: US 7,241,646 B2
(45) Date of Patent: Jul. 10, 2007

(54) SEMICONDUCTOR DEVICE HAVING VOLTAGE OUTPUT FUNCTION TRIM CIRCUITRY AND METHOD FOR SAME

(75) Inventors: Sean Malolepszy, Sherman, TX (US); Marty Grabham, McKinney, TX (US); Ronald Michallick, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/071,691

(22) Filed: Mar. 3, 2005

(65) Prior Publication Data
US 2006/0199283 A1   Sep. 7, 2006

(51) Int. Cl.
*H01L 21/82* (2006.01)
(52) U.S. Cl. ............................... 438/132; 257/E23.149
(58) Field of Classification Search ................ 438/538, 438/5, 7, 10–11, 14, 16, 17–18, 22–24, 29, 438/31, 34, 35–36, 128–130, 149, 484
See application file for complete search history.

(56) References Cited

U.S. PATENT DOCUMENTS

| | | | |
|---|---|---|---|
| 6,449,170 B1* | 9/2002 | Nguyen et al. | 361/778 |
| 2002/0037606 A1* | 3/2002 | Pricer et al. | 438/132 |
| 2003/0045026 A1* | 3/2003 | Fogal et al. | 438/107 |
| 2004/0018711 A1* | 1/2004 | Madurawe | 438/598 |
| 2005/0181546 A1* | 8/2005 | Madurawe | 438/132 |
| 2005/0214982 A1* | 9/2005 | Wu | 438/149 |

* cited by examiner

*Primary Examiner*—Michael Lebentritt
*Assistant Examiner*—Andre' Stevenson
(74) *Attorney, Agent, or Firm*—William B Kempler; W. James Brady, III; Frederick J. Telecky, Jr.

(57) ABSTRACT

In accordance with the teachings of the present invention, a semiconductor device having voltage output function trim circuitry and a method for the same are provided. In a particular embodiment, the method includes electrically coupling to a main circuit of a semiconductor device a plurality of resistances each operable to determine a different output voltage range of the main circuit, electrically coupling each of the plurality of resistances to a respective one of a plurality of fuses, electrically coupling each of a plurality of fuses to a respective one of a plurality of function trim pads, and electrically decoupling all but one of the plurality of resistances by applying a respective current between the respective function trim pads and an output node sufficient to open the respective fuses.

16 Claims, 2 Drawing Sheets

SEMICONDUCTOR DEVICE HAVING VOLTAGE OUTPUT FUNCTION TRIM CIRCUITRY AND METHOD FOR SAME

TECHNICAL FIELD

This invention relates generally to semiconductor fabrication, and more particularly to a semiconductor device having voltage output function trim circuitry and a method for the same.

BACKGROUND

Semiconductor devices are often produced in families that share a common parent design but differ in terms of a selected output parameter, such as output voltage. In devices such as these, different output voltages are typically produced by coupling the main circuitry of the device with an appropriate resistor value, selected from a bank of resistors that is common to the entire family, to produce the desired output voltage. Although the entire family includes the common resistor bank, each design is produced from its own wafer utilizing a separate metal layer mask that provides an interconnect to the proper resistor value to produce the desired output voltage for that particular design. Despite the flexibility offered by the common parent design, the use of individual wafers for each of the voltage ranges wastes circuit space on the wafer and increases the process cycle time during wafer production. Furthermore, having to shift between the individual child designs during production may add to the production costs of the devices.

SUMMARY OF THE INVENTION

In accordance with the teachings of the present invention, a semiconductor device having voltage output function trim circuitry and a method for the same are provided. In a particular embodiment, the method comprises electrically coupling to a main circuit of a semiconductor device a plurality of resistances each operable to determine a different output voltage range of the main circuit, electrically coupling each of the plurality of resistances to a respective one of a plurality of fuses, electrically coupling each of a plurality of fuses to a respective one of a plurality of function trim pads, and electrically decoupling all but one of the plurality of resistances by applying a respective current between the respective function trim pads and an output node sufficient to open the respective fuses.

A technical advantage of some embodiments of the present invention includes the ability to produce a variety of output voltage ranges from a single wafer. This not only decreases the process complexity, but allows each wafer to serve multiple purposes depending on the quantity of each voltage range desired.

Another technical advantage of some embodiments of the present invention includes a decrease in overall cycle time. By allowing the output voltage of the wafer to be changed "on the fly," particular embodiments of the present invention nullify the need to start new wafer lots to produce other desired output voltages.

Other technical advantages of the present invention may be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present invention and features and advantages thereof, reference is now made to the following description, taken in conjunction with the accompanying drawings, in which.

DESCRIPTION OF EXAMPLE EMBODIMENTS

In accordance with the teachings of the present invention, a semiconductor having voltage output function trim circuitry and a method for the same are provided. Generally, the semiconductor comprises a bank of resistors used to determine the output voltage of the semiconductor. Each of these resistors is coupled to an output node with a corresponding fuse. By selectively opening the fuses, the appropriate resistive load may be applied to the semiconductor to produce the desired output voltage. In particular embodiments, this allows several semiconductor devices having different output voltages to be produced from a single wafer, resulting in lower process complexity and reduced production cycle time.

However, while the present disclosure describes the use of function trim circuitry in regard to output voltages, the teachings of the present invention are not limited to selecting an output voltage range for a semiconductor device. Instead, the teaching of the present invention may be applied to select other output parameters of a semiconductor device from a range of options. With the benefit of this disclosure, it should be within the ability of one skilled in the art to utilize function trim circuitry to select other such output parameters.

Figure 1:
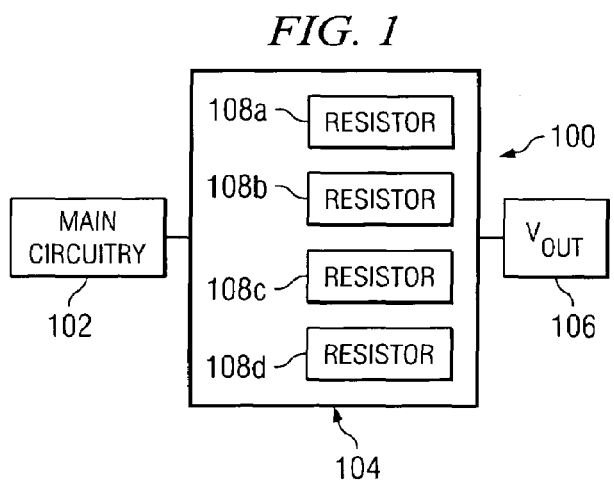
FIG. 1 illustrates a block diagram of semiconductor having voltage output function trim circuitry in accordance with one embodiment of the present invention.

With that understanding, FIG. 1 illustrates a block diagram of semiconductor device 100, which includes voltage output function trim circuitry in accordance with one such embodiment of the present invention. As shown in FIG. 1, semiconductor device 100 includes main circuitry 102, which comprises logic embedded in the semiconductor device. Main circuitry 102 is coupled to an output node 106 by function trim circuitry 104. Function trim circuitry 104 comprises circuitry that allows a user to select an output parameter of the semiconductor device from a predetermined set of options. In this example, that output parameter is the output voltage of device 100, which is determined by selecting the appropriate resistive load to apply to the circuit. Therefore, as shown in FIG. 1, function trim circuitry 104 includes four different resistances, which in this example are resistors 108a–d, each having a different resistance value. Although the various resistances are represented by four individual resistors 108 in this example, it will be understood that each resistance could comprise one or more resistors arranged in series or in parallel. Depending on the resistor 108 selected, a different output voltage range will result at output 106.

Figure 2:
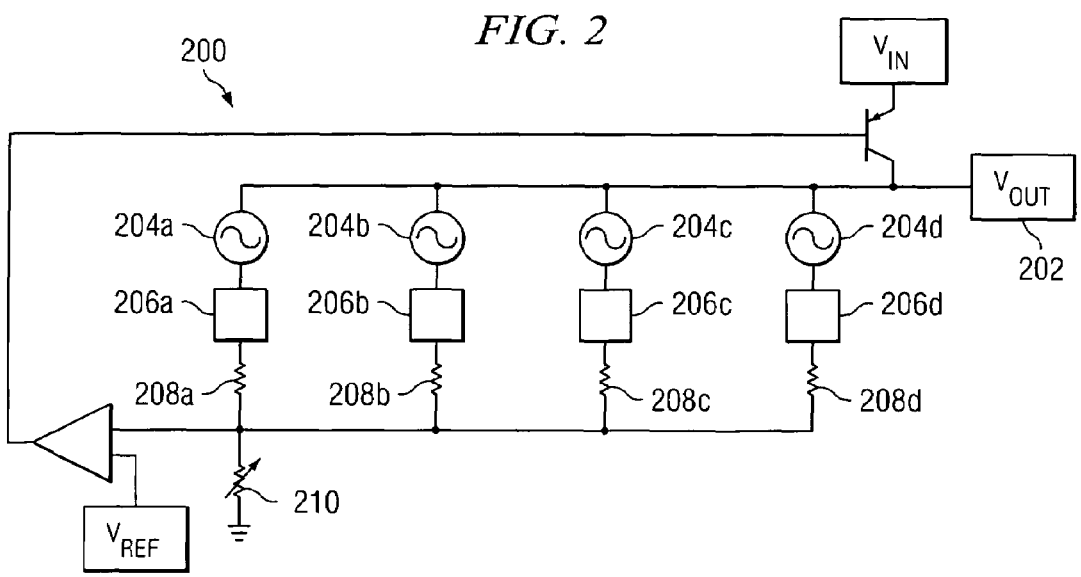
FIG. 2 illustrates a schematic of a voltage output function trim circuit in accordance with a particular embodiment of the present invention.

A better understanding of the function trim circuitry of the present invention may be had by making reference to FIG. 2, which illustrates a schematic of voltage output function trim circuit 200 in accordance with a particular embodiment of the present invention. As mentioned above, the function trim circuit of the present invention generally comprises a plurality of resistances, represented here by resistors 208a–d, each having a different resistance value. By selecting the appropriate resistor from this plurality of resistors, the function trim circuit will produce the desired resistive value, and thus a different output voltage range at output 202.

To facilitate this selection, each resistor 208a–d in circuit 200 is coupled to a corresponding fuse 204a–d. In particular embodiments of the present invention, each fuse 204 may have a different fuse value. Often, these different fuse values are stepped so that each consecutive fuse 204 requires a higher measure of current to open. By opening a particular fuse 204, the corresponding resistor 208 may be unselected, and effectively removed from the circuit. For example, by opening fuse 204b, resistor 208b may be removed from circuit 200 such that it does not affect the output voltage at output 202. Thus, each fuse 204 corresponding to the undesired resistors 208 may be opened until only the desired resistor 208 remains active in function trim circuit 200. This remaining resistor 208 thus determines the output voltage range of the semiconductor device.

To facilitate the opening of the appropriate fuses, circuit 200 also includes function trim pads 206a–d, corresponding to fuses 204a–d, respectively. Function trim pads 206 provide a location to contact a probe to supply the current necessary to open the selected fuses 204. For example, by placing a probe tip in contact with output 202 and function trim pad 206a and applying a sufficient current, fuse 204a may be opened, removing resistor 208a from the circuit.

Once the desired output voltage range has been selected by opening the appropriate fuses 204, particular embodiments of the present invention may use traditional trim circuitry 210 to precision tune the final output voltage of the semiconductor after the output voltage range had been selected using the function trim circuitry.

Figure 3:
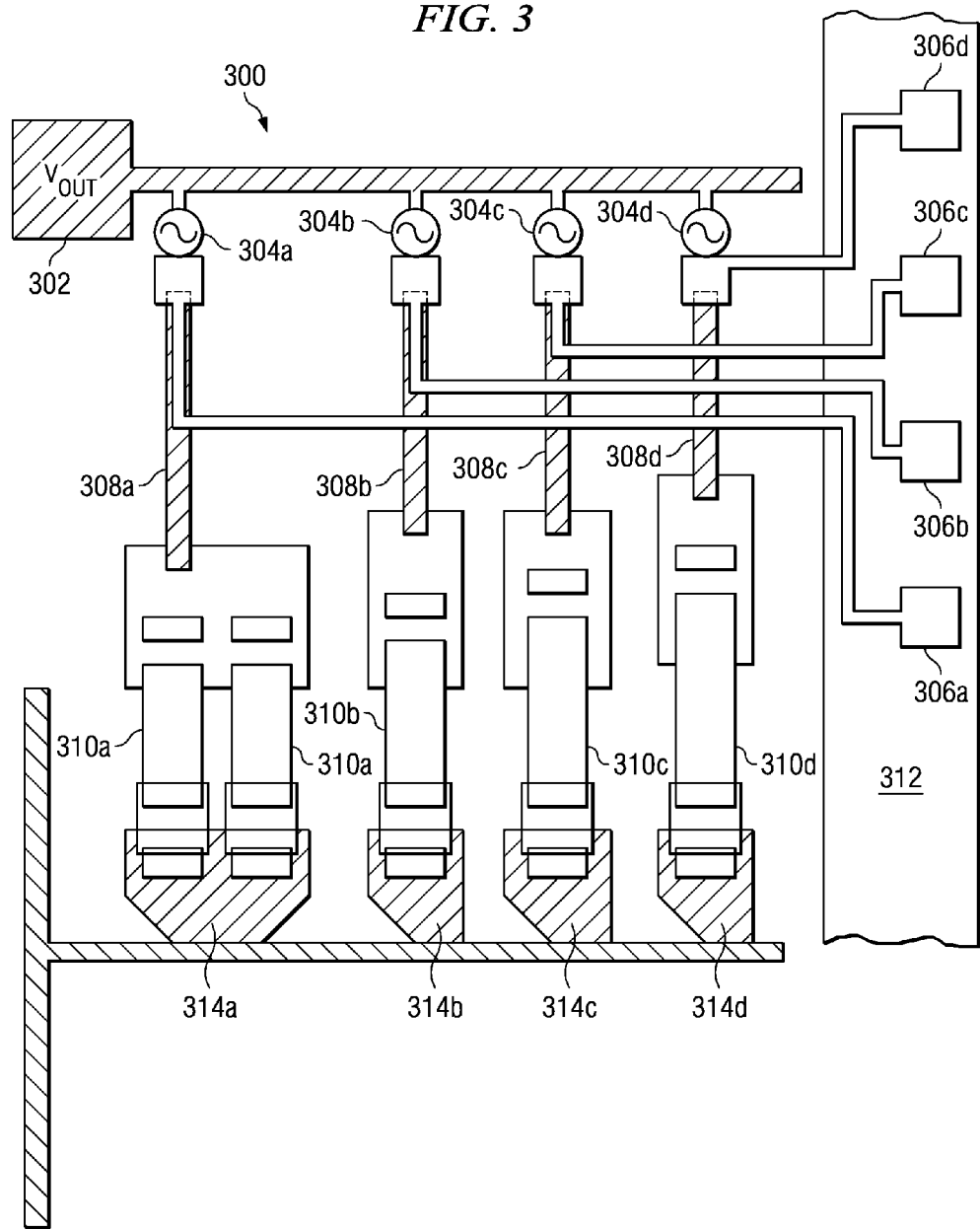
FIG. 3 illustrates a semiconductor wafer comprising voltage output function trim circuitry in accordance with a particular embodiment of the present invention.

An illustration of how the above-described function trim circuitry may appear on a die is shown in FIG. 3, which illustrates a wafer 300 in accordance with a particular embodiment of the present invention. As shown in FIG. 3, wafer 300 includes resistors 310a–d and corresponding fuses 304a–d. In particular embodiments, resistors 310a–d and fuses 304a–d may be coupled using low-ohmic tunnel resistors 308a–d, respectively. As discussed previously, by selectively opening the appropriate fuses 304, a resistor value may be selected to produce a desired output voltage range at output 302.

As shown in FIG. 3, wafer 300 also includes interconnects 314a–d, which couple resistors 310a–d, respectively, to the main circuitry of the semiconductor (not explicitly shown). Unlike traditional resistor bank designs, which include only a single interconnect coupled to the desired resistor bank, wafer 300 includes an interconnect 314 for each resistor 310. Rather than relying on the interconnect to select the appropriate resistor 310, particular embodiments of the present invention instead utilize fuses 308a–d to select the appropriate resistor. In this way, semiconductors utilizing any of the resistors 310 may be produced from wafer 300, reducing process complexity and reducing production cycle times that result from changing the desired output voltage.

Wafer 300 also includes function trim pads 306a–d, which provide a location to contact a probe to supply the current necessary to open the corresponding fuses 304a–d. In this particular embodiment, function trim pads 306 are located on a scribe street 312. By utilizing the scribe street 312 to place the function trim pads 306, the size of the die may not need to be increased to accommodate their addition. This helps overcome one of the major stumbling blocks to past attempts to provide all output voltage options on a single die. By using the scribe street 312 to place the trim pads 306, the final die dimensions of the semiconductor wafer 300 may be the same as those for wafers employing traditional resistor bank designs. It should be recognized, however, that the presence of metal structures, such as the function trim pads 306, in the scribe street 312 may be problematic due to the propensity of the metal to clog the saw blade used to remove the scribe street and separate the chips on the wafer. In particular embodiments of the present invention, this problem may be overcome by adding a process step that etches away the function trim pads 310 once the desired fuses 304 have been opened. Particular embodiments of the present invention may also locate the function trim pads at other locations on the die, all within the teachings of the present invention. Such a placement, however, may require increasing the final die dimensions.

Figure 4:
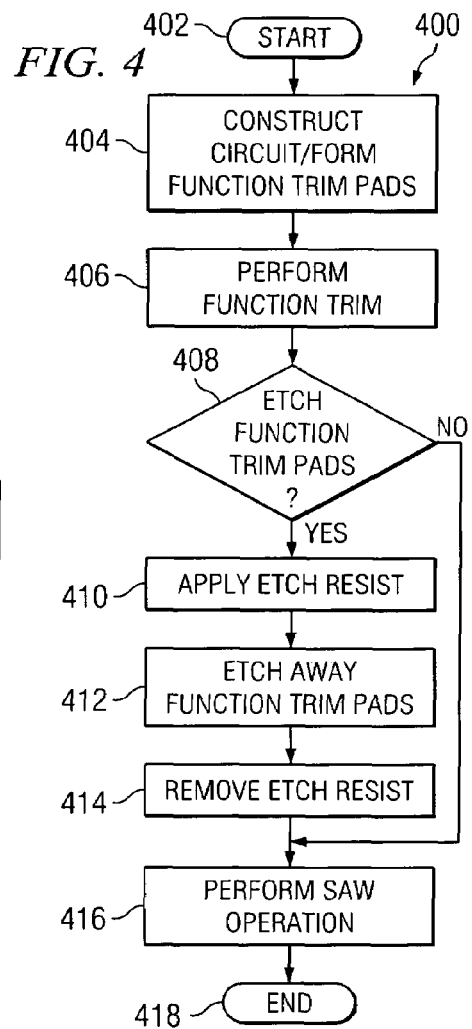
FIG. 4 illustrates a flow chart of a method of fabricating a semiconductor wafer in accordance with a particular embodiment of the present invention.

FIG. 4 illustrates a flow chart 400 of a method of fabricating a semiconductor wafer having output voltage function trim circuitry in accordance with a particular embodiment of the present invention. This process begins in block 402. After the fabrication process begins in block 402, the main circuitry and function trim circuitry of the semiconductor device are constructed in block 404. During this step function trim pads are formed on the scribe street adjacent to the semiconductor and electrically connected to the rest of the circuitry.

Once the function trim circuitry and function trim pads have been constructed, the desired output voltage range is selected by opening the appropriate fuses of the function trim circuitry in block 406. This may be accomplished by applying a current to the appropriate fuses sufficient to open the fuses between the appropriate function trim pads and the output of the device. In particular embodiments of the present invention, other trim processes may also be performed during this step, such as tempco trim and precision trim.

After the desired trim processes have been performed, a decision is made in block 408 regarding whether to remove the function trim pads prior to performing a saw operation on the wafer. As mentioned above, this may help reduce the wear on the saw used to separate the scribe street and reduce saw maintenance costs. If the function trim pads are to be removed prior to the saw operation, an etch resist is applied over the entire surface of the semiconductor wafer, except for the scribe street and function trim pads, in block 410. The function trim pads are then etched away in block 412. Once the function trim pads have been removed, the etch resist is then removed from the surface of the wafer in block 414, and a saw operation may be performed on the wafer in block 416.

If the function trim pads are not be removed prior to the saw operation, the process simply proceeds to the saw operation in block 416, where the scribe street is removed and the chips on the wafer are separated. After the saw operation has been completed, the fabrication process terminates in block 418.

By incorporating function trim circuitry into a semiconductor wafer, particular embodiments of the present invention offer the ability to produce an entire family of semiconductor devices from a single parent wafer design. Rather than having to produce multiple wafer designs, a single wafer design may be used to meet all of a users requirements for the different members of the device family. This helps reduce process complexity and may reduce overall cycle times.

Furthermore, particular embodiments of the present invention may be implemented by making only mask level changes. In such embodiments, no expensive hardware or costly retooling is needed to add the function trim circuitry to existing semiconductor wafer designs.

Finally, by reducing the number of wafer designs necessary to produce the family of semiconductor devices, particular embodiments of the present invention require less maintenance than tradition wafers employing resistor banks or other similar structures.

Although particular embodiments of the method and apparatus of the present invention have been illustrated in the accompanying drawings and described in the foregoing detailed description, it will be understood that the invention is not limited to the embodiments disclosed, but is capable of numerous rearrangements, modifications, and substitutions without departing from the spirit of the invention as set forth and defined by the following claims.

What is claimed is:

1. A method for manufacturing a semiconductor device, comprising:
    electrically coupling to a main circuit of a semiconductor device a plurality of components each operable to determine a different output parameter range of the main circuit;
    electrically coupling each of the plurality of components to a respective one of a plurality of fuses;
    electrically coupling each of the plurality of fuses to a respective one of a plurality of function trim pads;
    electrically decoupling at least one of the plurality of components by applying a respective current between the respective function trim pads and an output node sufficient to open the respective fuses; and further comprising removing at least one of the plurality of function trim pads from the semiconductor device after electrically decoupling at least one of the plurality of components.

2. The method of claim 1, wherein the plurality of components comprise a plurality of resistances each operable to determine a different output voltage range of the main circuit.

3. The method of claim 2, wherein each of the plurality of resistances comprise one or more resistors.

4. The method of claim 1, wherein at least one of the plurality of function trim pads is located on a scribe street adjacent to the main circuit of the semiconductor device.

5. The method of claim 1, further comprising electrically decoupling at all but one of the plurality of components by applying a respective current to the respective fuses.

6. The method of claim 1, further comprising fine-tuning the output parameter range of the main circuit using precision trim circuitry.

7. The method of claim 1, wherein each of the plurality of fuses requires a different measure of current to open.

8. A semiconductor device comprising:
    a main circuit;
    a plurality of components electrically coupled to the main circuit, each component operable to determine a different output parameter range of the main circuit wherein the plurality of components comprises a plurality of resistances, each operable to determine a different output voltage range of the main circuit;
    a plurality of fuses each electrically coupled to a respective one of the plurality of components; and
    wherein at least one of the plurality of fuses is open such that the respective component of the at least one of the plurality of fuses does not determine the output parameter range of the main circuit.

9. The semiconductor device of claim 8, wherein all but one of the plurality of fuses are open such that the respective components of the all but one of the plurality of fuses do not determine the output parameter range of the main circuit.

10. The semiconductor device of claim 8, wherein each of the plurality of fuses requires a different measure of current to open.

11. The semiconductor device of claim 8, wherein each of the plurality of resistances comprises one or more resistors.

12. The semiconductor device of claim 8, further comprising a plurality of function trim pads each electrically coupled to a respective one of the plurality of fuses.

13. The semiconductor device of claim 12, wherein at least one of the function trim pads is located on a scribe street adjacent to the main circuit.

14. The semiconductor device of claim 12, further comprising an output node of the semiconductor device;
    wherein the at least one of the plurality of fuses may be opened by applying a current between the output node and the function trim pad corresponding the at least one of plurality of fuses.

15. The semiconductor device of claim 8, further comprising precision trim circuitry operable to fine-tune the output parameter range of the main circuit.

16. The method of claim 1 wherein the output parameter range of the new circuit is the output voltage range of the main circuit.

* * * * *